(12) United States Patent
Le et al.

(10) Patent No.: US 6,881,593 B2
(45) Date of Patent: Apr. 19, 2005

(54) SEMICONDUCTOR DIE ADAPTER AND METHOD OF USING

(75) Inventors: Binh Q. Le, Vienna, VA (US); Ark L. Lew, Ellicott City, MD (US); Harry K. Charles, Jr., Laurel, MD (US); Paul D. Schwartz, Arnold, MD (US); Seppo J. Lehtonen, Columbia, MD (US); Sharon X. Ling, Clarksville, MD (US)

(73) Assignee: The Johns Hopkins University, Baltimore, MD (US)

( * ) Notice: Subject to any disclaimer, the term of this patent is extended or adjusted under 35 U.S.C. 154(b) by 327 days.

(21) Appl. No.: 10/159,682

(22) Filed: May 31, 2002

(65) Prior Publication Data

US 2003/0011060 A1 Jan. 16, 2003

Related U.S. Application Data

(60) Provisional application No. 60/294,737, filed on May 31, 2001.

(51) Int. Cl.[7] .............................................. H01L 21/66
(52) U.S. Cl. .............................. 438/14; 438/15; 438/18; 257/48; 257/777; 257/778; 257/782; 257/784
(58) Field of Search .............................. 257/777, 778, 257/782, 784, 48; 438/14, 15, 18

(56) References Cited

U.S. PATENT DOCUMENTS

| | | | |
|---|---|---|---|
| 5,258,648 A | * 11/1993 | Lin | .............................. 257/778 |
| 5,397,997 A | 3/1995 | Tuckerman et al. | ......... 324/754 |
| 5,440,241 A | 8/1995 | King et al. | .................. 324/765 |
| 5,571,027 A | 11/1996 | Roebuck et al. | ............. 439/264 |
| 5,677,575 A | 10/1997 | Maeta et al. | ................. 257/778 |
| 5,701,666 A | 12/1997 | DeHaven et al. | .............. 29/831 |
| 6,133,638 A | 10/2000 | Farnworth et al. | ........... 257/778 |
| 6,144,101 A | 11/2000 | Akram | ........................ 257/778 |
| 6,239,496 B1 | * 5/2001 | Asada | .......................... 257/777 |
| 6,291,884 B1 | * 9/2001 | Glenn et al. | ................. 257/747 |
| 6,323,663 B1 | 11/2001 | Nakata et al. | ............... 324/754 |
| 6,353,312 B1 | 3/2002 | Farnworth et al. | ........ 324/158.1 |
| 6,445,075 B1 | * 9/2002 | Scanlan et al. | .............. 257/778 |
| 6,552,426 B1 | * 4/2003 | Ishio et al. | .................. 257/692 |

* cited by examiner

*Primary Examiner*—Tom Thomas
*Assistant Examiner*—Matthew E. Warren
(74) *Attorney, Agent, or Firm*—Albert J. Fasulo, II

(57) ABSTRACT

A semiconductor die adapter assembly includes a semiconductor die cut from a wafer, the die having an active surface including bond pads. A die adapter, also having bond pads, is bonded to the semiconductor die. Die-to-adapter connectors electrically connect the die bond pads to the adapter bond pads. Finally, adapter-to-substrate connectors electrically connect the adapter bond pads to a device substrate. Having bond pads on the die adapter eliminates the need to break and remake the electrical connections to the original bond pads on the die during burn-in testing of the die.

1 Claim, 4 Drawing Sheets

SEMICONDUCTOR DIE ADAPTER AND METHOD OF USING

CROSS-REFERENCE TO RELATED APPLICATION

This application claims the benefit of the co-pending U.S. Provisional Application No. 60/294,737, filed on May 31, 2001.

BACKGROUND OF THE INVENTION

1. Field of the Invention

The present invention relates to an apparatus and method for reliably testing and installing individual integrated circuit chips using die adapters that minimize damage to the chips.

2. Description of the Related Art

A semiconductor die (plural "dice") is an integrated circuit designed to serve a specific function, such as a memory chip, in an electronic device. Dice are generally fabricated together in rows on a silicon wafer. During die fabrication, also known as wafer processing, photolithography is traditionally used to first print an image of the micro-circuitry of each die on a wafer surface, duplicating the circuit image at each adjacent die location until the wafer surface is filled. Subsequent processing often including ion implantation, epitaxial deposition, metallization and polishing result in a finished wafer comprising numerous individual integrated circuit chips. Before use, the chips are generally cut from the wafer and packaged in, for example, multi-chip modules (MCM's) for incorporation into final electronic devices such as computers and cell phones. However, because the yield of a wafer (i.e., the percentage of chips on a wafer that function properly) is often not very high, it is important to determine which chips are defective and which chips are functional before the chips are packaged. Defective die are discarded or repaired so that only functional "known good die" (KGD) are packaged in electronic devices.

Knowing whether a die is a "known good die" before it is packaged is increasingly important as more and more chips are packed into individual MCM's. Otherwise, the compound effect of the individual yields of the different chips can result in very low yields of functioning MCM's.

Determining the yield of a wafer and isolating the KGD's is often performed through batch testing of dice using test probes before the dice are cut from a wafer. The probes are used to conduct "burn-in" tests where the dice are rigorously exercised through various temperature cycles, including high temperatures, and at high potentials. Defective dice are generally expected to fail after a certain number of hours of burn-in testing. A die that passes the tests, and that is subsequently integrated into an electronic device, generally has a high probability of performing properly over the expected life of the device (a phenomenon sometimes referred to as "fail early or never fail"). Examples of such burn-in test procedures performed on uncut wafers are disclosed in U.S. Pat. No. 6,323,663 to Nakata et al.; U.S. Pat. No. 5,701,666 to DeHaven et al.; and U.S. Pat. No. 5,440,241 to King et al.

Sometimes it is not feasible to conduct a final die test before dice are cut from a wafer. Where very high reliability is required, for example in spacecraft electronics, end users of a chip often need to retest an individual cut die after receiving the die from a die manufacturer and immediately before packaging the die in a device or module. Such final testing procedures can be difficult and time consuming and particular care must be taken so that the testing procedure itself doesn't damage an otherwise good die. Traditional procedures require placing a die in a temporary package, testing the die in the package, and then removing the die from the package. These procedures have several inherent problems. First, to be successfully tested in a temporary package, a die often requires enlarged pads, to which the test leads of the package are wire bonded, and the enlarged pads can reduce integrated circuit density. Dies with a small pad pitch, i.e., center-to-center distance between the pads, make it difficult to reliably connect test leads. Second, the bond wires of the test package often need to be broken off and removed from the chips before final packaging. The process of removing bond wires will frequently damage the bond pads of a die. Finally, the above procedures require an excessive amount of die handling that increases the chances of damaging the die.

U.S. Pat. No. 6,353,312 to Farnworth et al. and U.S. Pat. No. 5,571,027 to Roebuck et al. disclose temporary test packages designed to avoid the above mentioned problems concerning testing an individual die. The '312 patent discloses a positioning device for accurately and efficiently placing dice in temporary packages to avoid handling damage. The '027 patent discloses an interconnect system using a socket with spring biased contacts to lock a die in place during testing and to minimize die pad damage during debonding of test leads. Both the '312 patent and the '027 patent disclose complex devices used in high volume chip testing; however more economical methods are needed for low volume testing processes.

Therefore there is a need for an improved, economical and non-destructive method for testing individual semiconductor chips after the chips have been cut from a wafer and before they are assembled in a module.

SUMMARY OF THE INVENTION

The present invention is directed to a semiconductor die adapter assembly. An object of the present invention is to provide a second set of bond pads on the die adapter so that electrical connections to the original bond pads on the die are not broken and remade during burn-in testing of a die. Another object of the present invention is to provide bond pads on a semiconductor die adapter that are more robust than the relatively fragile bond pads on the die. Yet another object of the present invention is to provide a durable semiconductor die adapter that is less subject to damage caused by die handling tools than a bare semiconductor die. Still another object of the present invention is to provide a semiconductor die adapter that has bond pads of greater surface area than the bond pads of its associated die to enable easier electronic testing of the die.

According to the present invention, a semiconductor die adapter assembly includes a semiconductor die cut from a wafer, the die having an active surface including bond pads. A die adapter, also having bond pads, is bonded to the semiconductor die. Die-to-adapter connectors electrically connect the die bond pads to the adapter bond pads. Finally, adapter-to-substrate connectors electrically connect the adapter bond pads to a device substrate.

DESCRIPTION OF THE PREFERRED EMBODIMENTS

Figure 1:
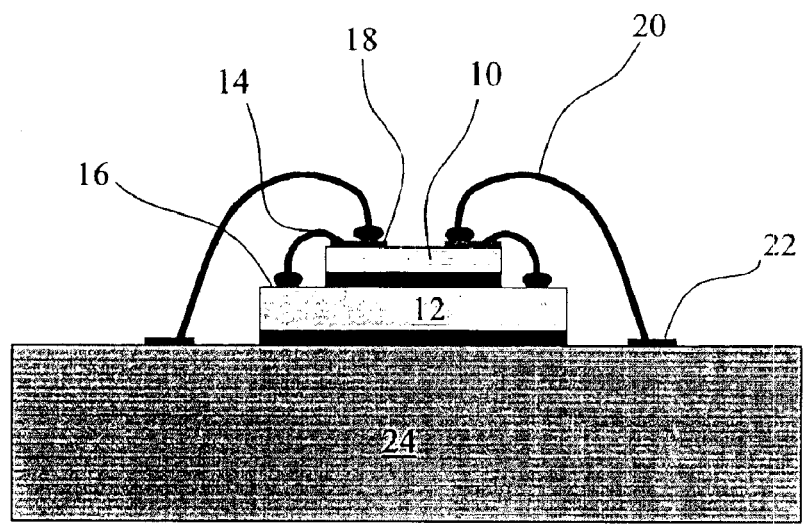
FIG. 1 is a schematic diagram illustrating a side view of a first embodiment of the present invention.

A first embodiment of the present invention is illustrated in FIG. 1. It includes an adapter 10 that is bonded to the active side of an integrated circuit die 12. Die-to-adapter connectors 14 connect die bond pads 16 to corresponding adapter bond pads 18. Finally, adapter-to-substrate connectors 20 connect the adapter bond pads 18 to device contacts 22 on a device substrate 24 such as a printed circuit board or module.

A significant feature of the present invention teaches that the adapter 10 may be permanently bonded to the die 12 so that the adapter 10 may accompany the die 12 through testing in a temporary package and into final assembly in a device or module. That means that the die-to-adapter connectors 14 are bonded to the die bond pads 16 only once. The adapter bond pads 18 may be designed to be larger and more robust than the corresponding die bond pads 16. Increasing bond pad surface area on the adapter 10 results in more reliable bonds. Also, because connections to the relatively fragile die bond pads 16 are not broken and reworked, damage to the die 12, which can occur frequently using prior art techniques, is avoided.

The adapter 10 may be designed as a multilayer structure and can be made from various dielectric materials such as ceramic, or laminates in either a rigid or flexible format. The adapter is designed to simply convert the electrical interface, i.e., bond pads 16, of the die 12 to the next usable electrical interface.

After the adapter 10 is connected to the die 12 as described above, the assembly can be placed into a temporary package for testing. Test leads can then be, for example, wire bonded to the adapter bond pads 18. After a burn-in test, the test leads are simply removed from the adapter bond pads 18 and the die/adapter assembly is ready to be packaged into a final device or module. All test package connections, bond breaks, and rebonding affect only the relatively robust adapter bond pads 18, leaving the relatively fragile die bond pads 16 alone.

Damage to the die 12 is further minimized according to the present invention because die handling and placement tools are able to grasp the adapter 10 and leave the die 12 untouched. The adapter 10 is designed to withstand mild abuse and the forces of placement tools much better than the fragile die 12.

Figure 2:
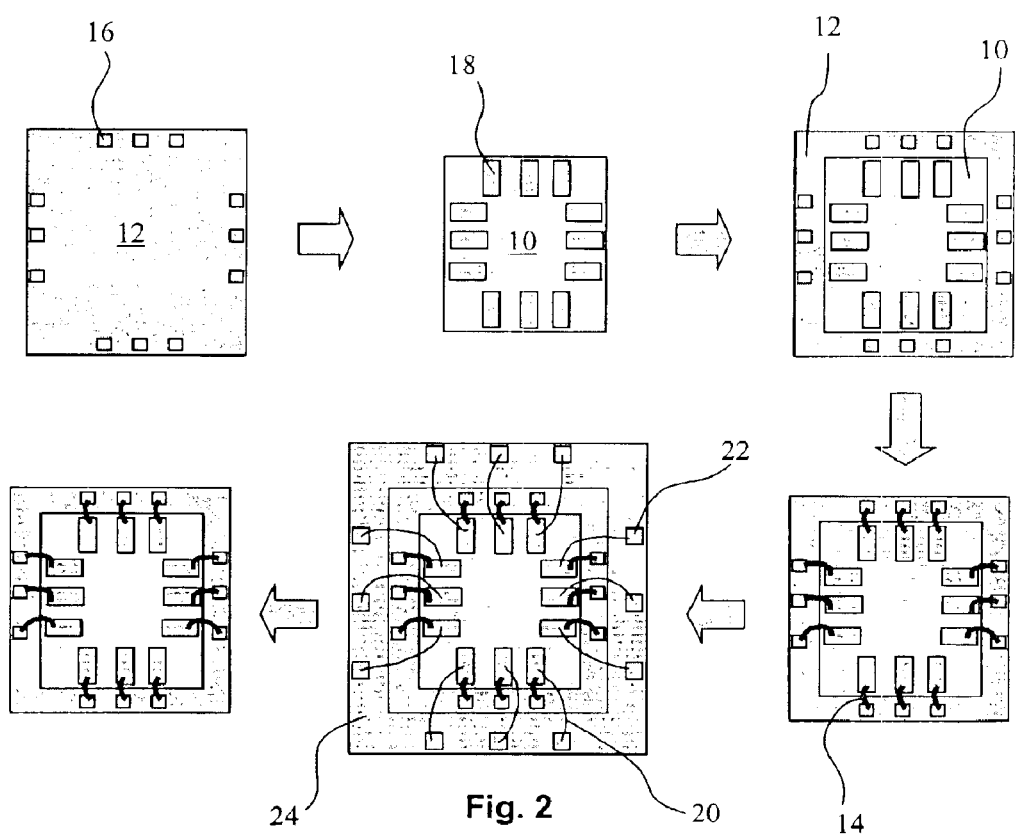
FIG. 2 is a process flow diagram illustrating top views of the embodiment shown in FIG. 1.

FIG. 2 is a process flow diagram illustrating top views of the embodiment shown in FIG. 1 during various stages of fabrication and testing. Starting with a bare die 12 shown in the upper left hand corner of FIG. 2, the adapter 10 is connected to the die 12 and the assembly is then placed on the substrate 24 of a test package. After testing, the adapter-to-substrate connectors are removed and the die/adapter assembly is ready for final packaging, as shown in the lower left hand corner of FIG. 2.

Additional embodiments of the present invention are described below concerning different die geometries and die-attach adhesives and connectors. These are selected to obtain desired physical properties and reliability while maximizing manufacturing efficiency.

Figure 3:
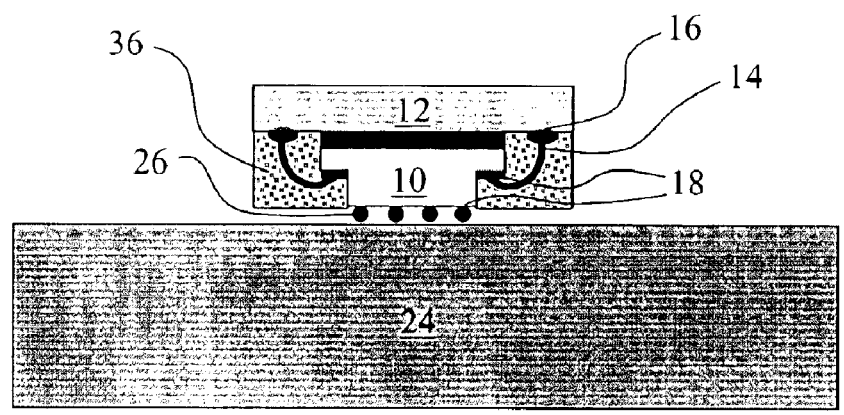
FIG. 3 is a schematic diagram illustrating a side view of a second embodiment of the present invention involving a flip chip.

FIG. 3 illustrates a second embodiment of the present invention involving a flip chip. Here the adapter 10 and the die 12 are turned upside down and the active surface of the die 12 faces the substrate. The die-to-adapter connectors 14 may again comprise wire bonds; however the adapter-to-substrate connectors 20 may comprise, instead of wire bonds, reflowed solder bumps 26 connected to the underside of the adapter 10. The solder bumps 26, another source of frequent defects and shorts in traditional integrated circuit packages, are attached to the more robust adapter bond pads 18. A polymer encapsulant 36 may be added around the base of the die 12 to protect the electrical connections.

Figure 4:
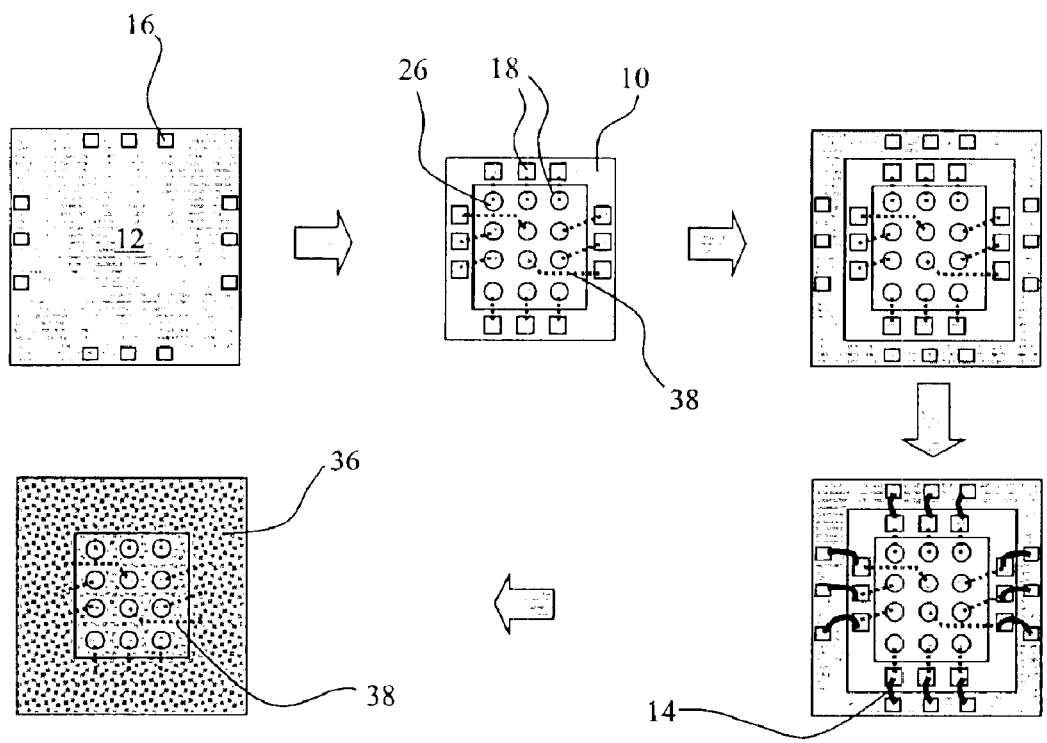
FIG. 4 is a process flow diagram illustrating bottom views of the embodiment shown in FIG. 3.

FIG. 4 is a process flow diagram illustrating bottom views of the embodiment shown in FIG. 3 during various stages of fabrication. Starting with a bare flip chip die 12 shown in the upper left hand corner of FIG. 4, the adapter 10 is bonded to the die 12 and wire bonds are used as the die to adapter electrical connectors 14, which are finally covered by the encapsulant 36. Also shown in FIG. 4, as dashed lines, are the internal electrical traces 38 of the adapter 10 connecting the solder bumps 26 to the adapter bond pads 18.

Figure 5A:
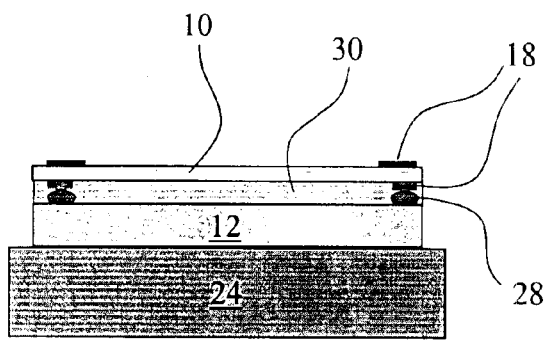
FIGS. 5A and 5B are schematic diagrams of an embodiment of the present invention comprising bond pads on both sides of the die adapter.

FIGS. 5 and 6 illustrate embodiments of the present invention that comprise interconnected bond pads 18 located on both sides of the adapter 10. In FIG. 5A the die-to-adapter connectors 14 are gold stud bumps 28. During assembly, the gold stud bumps 28 are welded to the die 12 by a thermosonic process that uses heat and ultrasonic energy to soften the gold and speed up the welding process. The gold stud bumps 28 may be coined or not coined. The adapter 10 is then aligned and assembled on top of the die 12 by applying heat and pressure to the assembly. An epoxy underfill 30 may also be injected in the area between the adapter 10 and the die 12 in order to help ensure high reliability. The underfill 30 protects the face of the chip against moisture and impurities, strengthens the adapter 10 and die 12 assembly, and absorbs some of the forces developed by different thermal expansion coefficients of the adapter 10 and die 12. The gold stud bumps 28 transfer all electrical interfaces of the die 12 to the adapter 10. Finally, bond pads 18 on the top surface of the adapter 10 are metalized with gold or aluminum for attachment of wire bond adapter-to-substrate connectors.

Figure 5B:
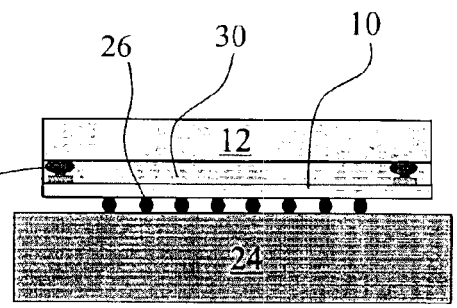

FIG. 5B shows a flip chip with an adapter-to-die connection using gold stud bumps 28. The underfill 30 protects the die surface and strengthens the bonds between the adapter 10 and the die 12. The lower side of the adapter 10 is connected directly to the substrate 24 using reflowed solder bumps 26.

Figure 6A:
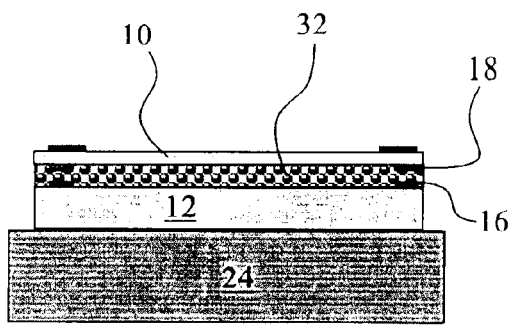
FIGS. 6A and 6B are schematic diagrams of the embodiments shown in FIGS. 5A and 5B, respectively, however the die-to-adapter connectors comprise anisotropic conductive adhesive.
Figure 6B:
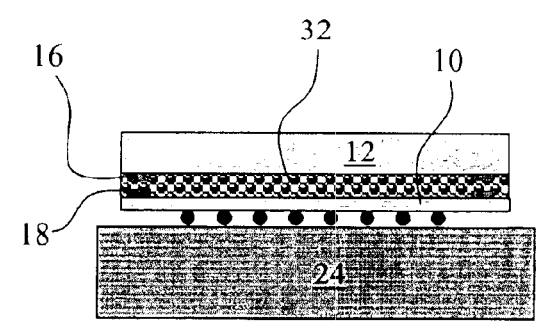

FIGS. 6A and 6B correspond to FIGS. 5A and 5B, respectively, however in FIGS. 6A and 6B the die-to-adapter connectors 14 comprise anisotropic conductive adhesive 32. The anisotropic conductive adhesive 32 is filled with small conductive particles that create the electrical contact between the die bond pads 16 and the adapter bond pads 18. The adhesive 32 can be applied as a film or as a paste. In order to bring the conductive particles, spread at random in the adhesive 32, in continuous contact with the bond pads, the adapter 10 and die 12 assembly are heated under pressure. The conductive particles provide the electrical connection between the die bond pads 16 and the corresponding adapter bond pads 18; however, in the interstices between adjacent die bond pads 16 the conductive particles are adequately spaced apart so as not to create electrical shorts Anisotropic conductive adhesives are often a preferred alternative to solder because of the many problems associated with solder joints such as stress cracking, thermal mismatch problems, leaching, and the environmental hazards associated with lead and with solder fluxes. Further, the use of anisotropic conductive adhesives often eliminates the need for injecting underfill 30.

Figures 7A, 7B:
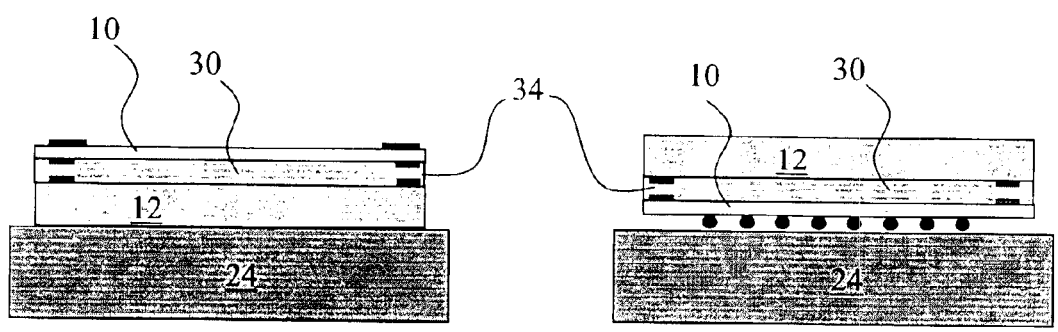
FIGS. 7A and 7B are schematic diagrams of embodiments of the present invention comprising isotropic conductive adhesive between the die bond pads and the adapter bond pads.

FIGS. 7A and 7B illustrate embodiments of the present invention employing isotropic conductive adhesive 34 between the die bond pads 16 and the adapter bond pads 18. The interstices between the adapter 10 and the die 12 are injected with underfill 30. Here again bumped chips and adapters may also be used in various combinations with the isotropic conductive adhesive 34.

The above therefore discloses an apparatus and method for testing and then installing in a final device individual integrated circuit chips using robust die adapters that minimize damage to the chips. Alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

We claim:

1. A method of using a die adapter assembly to test a die, comprising the steps of:

cutting a die from a wafer;

bonding a die adapter that is smaller than said die to said die to form a die/adapter assembly;

electrically connecting bond pads on said die to bond pads on said die adapter;

placing said die/adapter assembly in a test package using tools that touch primarily said adapter and not said die;

electrically connecting, using wire bonds, said bond pads on said die adapter to a substrate of said test package;

testing said die using said test package;

removing said wire bonds between said die adapter bond pads and said test package substrate; and removing said die/adapter assembly from said test package and installing said die/adapter assembly on a final device substrate using tools that touch primarily said adapter and not said die.

\* \* \* \* \*